(12) United States Patent
Wang et al.

(10) Patent No.: US 11,094,880 B2
(45) Date of Patent: Aug. 17, 2021

(54) RESISTIVE RANDOM ACCESS MEMORY STRUCTURE AND METHOD FOR MANUFACTURING THE SAME

(71) Applicant: UNITED MICROELECTRONICS CORP., Hsinchu (TW)

(72) Inventors: Wen-Jen Wang, Tainan (TW); Chun-Hung Cheng, Kaohsiung (TW); Chuan-Fu Wang, Miaoli County (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 24 days.

(21) Appl. No.: 16/504,491

(22) Filed: Jul. 8, 2019

(65) Prior Publication Data

US 2021/0013403 A1 Jan. 14, 2021

(51) Int. Cl.
*H01L 45/00* (2006.01)
*H01L 27/24* (2006.01)

(52) U.S. Cl.
CPC ........ *H01L 45/124* (2013.01); *H01L 27/2463* (2013.01); *H01L 45/08* (2013.01); *H01L 45/1253* (2013.01); *H01L 45/146* (2013.01); *H01L 45/16* (2013.01)

(58) Field of Classification Search
CPC ... H01L 45/124; H01L 27/2463; H01L 45/08; H01L 45/1253; H01L 45/146
USPC .......................................................... 257/4
See application file for complete search history.

(56) References Cited

U.S. PATENT DOCUMENTS

| 8,169,053 | B2 | 5/2012 | Kim et al. |
| 9,099,647 | B2 | 8/2015 | Liao et al. |
| 10,153,432 | B2 | 12/2018 | Zhu |
| 2014/0097396 | A1* | 4/2014 | Murase ............... H01L 45/1286 257/2 |

* cited by examiner

*Primary Examiner* — Elias Ullah
(74) *Attorney, Agent, or Firm* — WPAT, PC

(57) ABSTRACT

A resistive random access memory structure includes a bottom electrode; a variable resistance layer disposed on the bottom electrode; a top electrode disposed on the variable resistance layer; a protection layer surrounding the variable resistance layer, wherein a top surface of the protection layer and a top surface of the top electrode are coplanar; and an upper interconnect structure disposed on the top electrode, wherein the upper interconnect structure is electrically connected to the top electrode and directly contacts a sidewall of the protection layer.

6 Claims, 4 Drawing Sheets

RESISTIVE RANDOM ACCESS MEMORY STRUCTURE AND METHOD FOR MANUFACTURING THE SAME

BACKGROUND OF THE INVENTION

Field of the Invention

The invention relates in general to a memory structure and a method for manufacturing the same, and more particularly to a resistive random access memory structure and a method for manufacturing the same.

Description of the Related Art

Resistive random access memories (RRAMs) are non-volatile memory devices using changes in resistance characteristics of a material to store data. For example, one RRAM cell may include a variable resistance layer disposed between a top electrode and a bottom electrode. A protection layer may be adjacent to the RRAM cell to protect the RRAM cell from being damaged during the manufacturing process (such as an etching process). However, the conventional method for manufacturing the RRAMs may produce a protection layer which can not well protect the RRAM cells, and a short issue may be raised accordingly.

SUMMARY OF THE INVENTION

The invention is directed to a RRAM structure and the manufacturing method thereof. In the RRAM structure, since a top surface of the protection layer and a top surface of the top electrode are coplanar, the sidewall of the RRAM cell can be well protected by the protection layer; so that a short issue between the variable resistance layer and the upper interconnect structure can be prevented.

According to one aspect of the present invention, a resistive random access memory structure is provided. The resistive random access memory structure includes a bottom electrode; a variable resistance layer disposed on the bottom electrode; a top electrode disposed on the variable resistance layer; a protection layer surrounding the variable resistance layer, wherein a top surface of the protection layer and a top surface of the top electrode are coplanar; and an upper interconnect structure disposed on the top electrode, wherein the upper interconnect structure is electrically connected to the top electrode and directly contacts a sidewall of the protection layer.

According to one aspect of the present invention, a method for forming a resistive random access memory structure is provided. The method comprises: forming a bottom electrode; forming a variable resistance layer disposed on the bottom electrode; forming a top electrode disposed on the variable resistance layer; forming a protection layer surrounding the variable resistance layer, wherein a top surface of the protection layer and a top surface of the top electrode are coplanar; and forming an upper interconnect structure disposed on the top electrode, wherein the upper interconnect structure is electrically connected to the top electrode and directly contacts a sidewall of the protection layer.

The above and other aspects of the invention will become better understood with regard to the following detailed description of the preferred but non-limiting embodiment(s). The following description is made with reference to the accompanying drawings.

DETAILED DESCRIPTION OF THE INVENTION

FIGS. 1-5 are cross-sectional views showing a process for manufacturing a random access memory structure according to one embodiment of the invention, and illustrate a plane of a X-axis and a Z-axis, for example. The X-axis may be perpendicular to the Z-axis and a Y-axis, but the present invention is not limited thereto.

Figure 1:
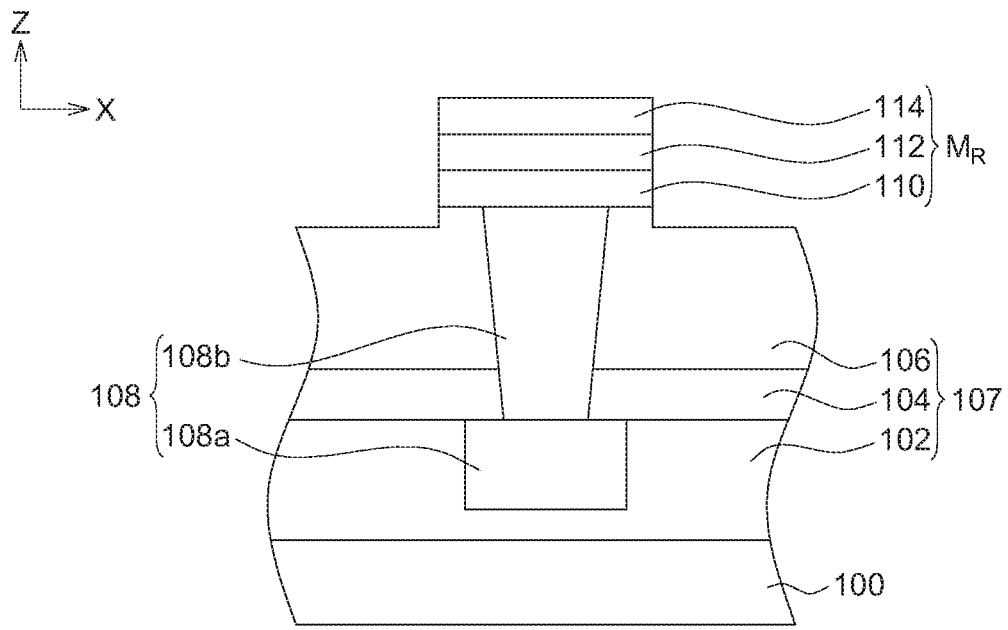
FIGS. 1-5 are cross-sectional views showing a process for manufacturing a random access memory structure according to one embodiment of the invention.

Referring to FIG. 1, a substrate 100 is provided. The substrate 100 may be a semiconductor substrate (for example, a silicon substrate). A lower dielectric layer 107 is formed on the substrate 100. The lower dielectric layer 107 can be a single layer structure or a multi-layer structure. In the present embodiment, the lower dielectric layer 107 includes a first dielectric layer 102, a second dielectric layer 104 and a third dielectric layer 106 sequentially formed on the substrate 100 by chemical vapor deposition (CVD) methods, for example. The material of the first dielectric layer 102 is silicon oxide, for example. The material of the second dielectric layer 104 may be Silicon Carbonitride (SiCN), for example. The material of the third dielectric layer 106 may be ultra-low-k dielectric material, for example.

A lower interconnect structure 108 may be formed in the lower dielectric layer 107. The lower interconnect structure 108 may be a via, a trench or a combination thereof. The lower interconnect structure 108 may be a single-layer structure or a multi-layer structure. In this embodiment, the lower interconnect structure 108 is exemplified as the multi-layer structure, but the invention is not limited thereto. For example, the lower interconnect structure 108 may include a first interconnect 108a and a second interconnect 108b. The material of the lower interconnect structure 108 is Cu, Al or W, for example. The method of forming the lower interconnect structure 108 is a damascene method, for example. A barrier layer (not shown) may be formed between the lower interconnect structure 108 and the lower dielectric layer 107.

A plurality of RRAM cells $M_R$ (not shown) are formed on the substrate 100. One RRAM cell MR is exemplified illustrated in FIG. 1. For example, each of the RRAM cells $M_R$ may be formed on the third dielectric layer 106 and the lower interconnect structure 108. The RRAM cells $M_R$ are adjacent to each other. Each of the RRAM cells $M_R$ may include a bottom electrode 110, a variable resistance layer 112 and a top electrode 114. The top electrode 114 may be disposed on the bottom electrode 110. The variable resistance layer 112 may be disposed between the bottom electrode 110 and the top electrode 114.

The material of the bottom electrode 110 is tantalum nitride (TaN) or titanium nitride (TiN), for example. The material of the top electrode 114 includes tantalum nitride (TaN) or titanium nitride (TiN), for example. The methods of forming the bottom electrode 110 and the top electrode 114 are the CVD method, for example. The bottom electrode 114 may be electrically connected to the lower interconnect structure 108.

The top electrode 114 may be a single-layer structure or a multi-layer structure. For example, the top electrode 114 may be a bilayer structure, and include a lower conductor layer and an upper conductor layer disposed on the lower conductor layer, but the present invention is not limited thereto. The material of the lower conductor layer is Ir, W or Pt, for example. The method of forming the lower conductor layer is a physical vapor deposition (PVD) method. The material of the upper conductor layer is tantalum nitride (TaN) or titanium nitride (TiN), for example. The method of forming the upper conductor layer is a CVD method.

The material of the variable resistance layer 112 is tantalum oxide (TaOx), hafnium oxide (HfOx) or titanium oxide (TiOx), for example. The variable resistance layer 112 may be a single-layer structure or a multi-layer structure. The method of forming the variable resistance layer 112 is the CVD method or the PVD method.

Figure 2:
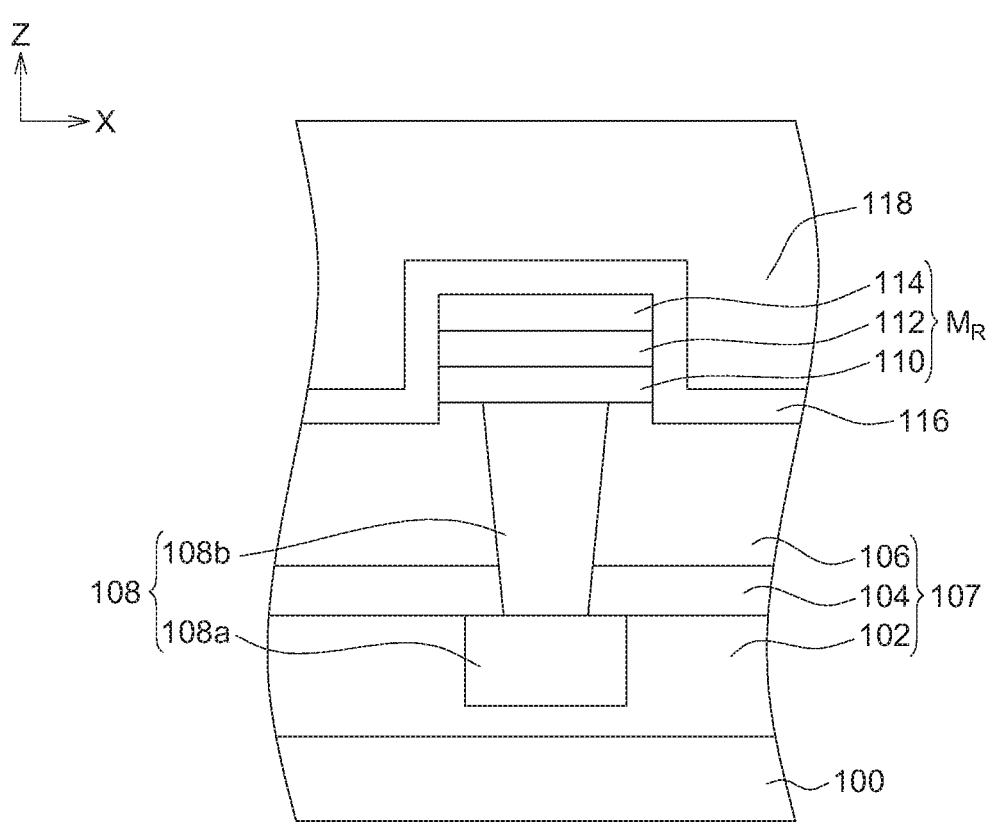

Referring to FIG. 2, a protection material layer 116 is conformally formed on the top electrode 114, i.e. on the RRAM cell $M_R$. Then, a fourth dielectric material layer 118 is formed on the protection material layer 116. The material of the protection material layer 116 is silicon nitride, for example. The material of the fourth dielectric material layer 118 may be ultra-low-k dielectric material, for example. In the present embodiment, the materials of the third dielectric layer 106 and the fourth dielectric material layer 118 may be the same, but the present invention is not limited thereto. The methods of forming the protection material layer 116 and the fourth dielectric material layer 118 are respectively the CVD methods, for example.

Figure 3:
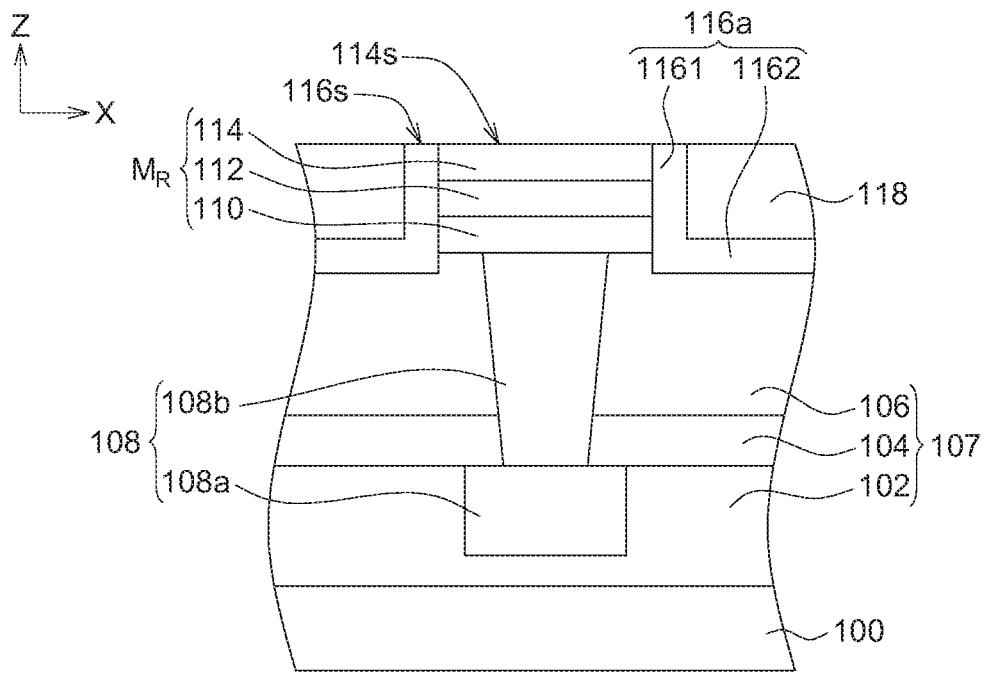

Referring to FIG. 3, a protection layer 116a is formed by a chemical mechanical polishing (CMP) process, and a top surface 114s of the top electrode 114 and a top surface 116s of the protection layer 116a are exposed. The top surface 114s of the top electrode 114 and the top surface 116s of the protection layer 116a are coplanar. The top surface 114s of the top electrode 114 has a height relative to the substrate 100 which is equal to that of the top surface 116s of the protection layer 116a.

The protection layer 116a surrounds the RRAM cell $M_R$, and has an L shape in a cross-section view, for example. The protection layer 116a includes a connection portion 1161 and an extension portion 1162. A sidewall of the RRAM cell $M_R$ may be completely covered by the protection layer (such as by the connection portion 1161), and the connection portion 1161 may directly contact the sidewall of the RRAM cell $M_R$. That is, the connection portion 1161 may directly contact sidewalls of the top electrode 114, the variable resistance layer 112 and the bottom electrode 110. Thus, the sidewall of the RRAM cell $M_R$ can be well protected by the protection layer 116a, and no conductive material can be connected to the sidewall of the RRAM cell $M_R$ in the following process, and a short issue can be avoided accordingly.

The connection portion 112 has an upper portion and a lower portion more adjacent to the substrate 100 than the upper portion. The extension portion 1162 also has an upper portion and a lower portion more adjacent to the substrate 100 than the upper portion. The extension portion 1162 is connected to a lower portion of the connection portion 1161, and the upper portion of the extension portion 1162 is lower than the upper portion of the connection portion 1161. The extension portion 1162 may be connected between the connection portions 1161 in a region between the RRAM cells $M_R$ (not shown). In some embodiment, the extension portion 1162 may not be parallel to a top surface of the substrate 100, but have a slope with the top surface of the substrate 100.

Since the protection layer 116a can be formed by the CMP process, the top surface 114s of the top electrode 114 and the top surface 116s of the protection layer 116a are exposed in the same process, and are coplanar. In comparison with a comparison embodiment that the protection layer is patterned to have a D shape, and the sidewall of the variable resistance layer may be exposed since the control to the height of the protection layer is difficult, the protection layer of the present invention can completely cover the sidewall of the RRAM cell $M_R$ so that the sidewall of the RRAM cell $M_R$ can be perfectly protected, a short issue can be prevented, and the RRAM of the present invention can have a better electrical performance. Moreover, no extra process is needed to form the protection layer 116a, the manufacturing process is more simple in comparison with a comparison embodiment having many processes to from a protection layer.

Figure 4:
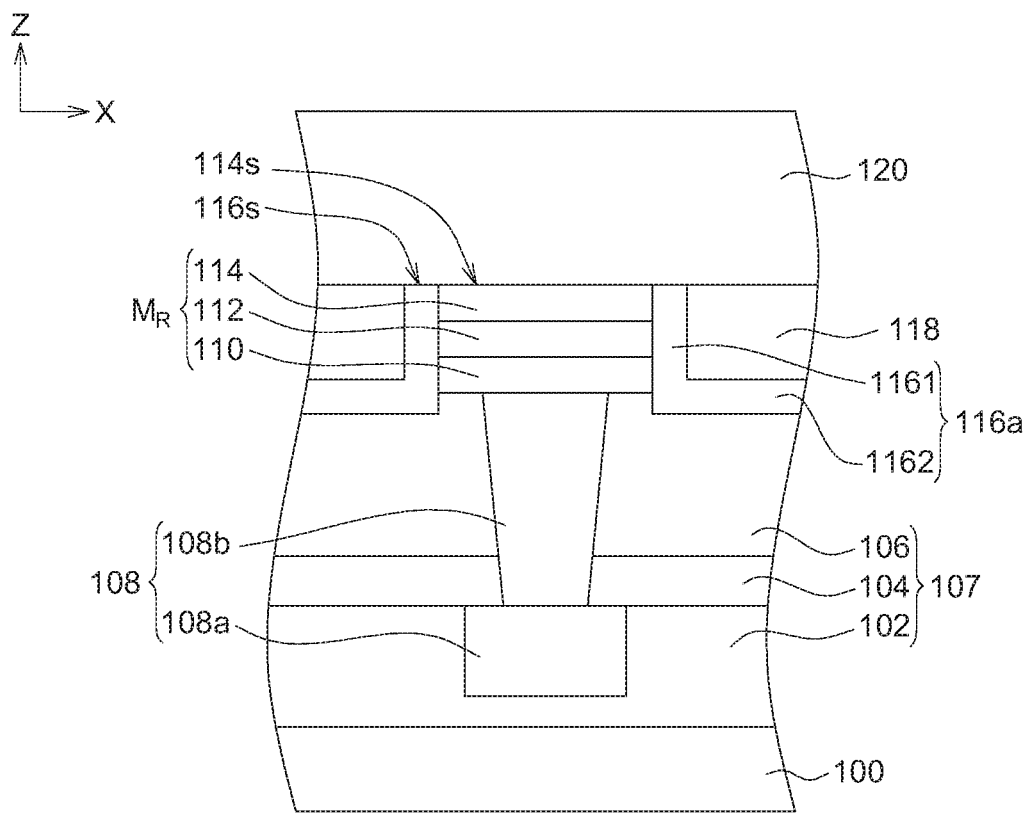

Referring to FIG. 4, a fifth dielectric material layer 120 is formed on the fourth dielectric material layer 118, the protection layer 116a and the RRAM cell $M_R$. The material of the fifth dielectric material layer 120 is ultra-k-dielectric material, for example. The fifth dielectric material layer 120 and the fourth dielectric material layer 118 may be formed of the same material, but the present invention is not limited thereto. The method of forming the fifth dielectric material layer 120 is the CVD method, for example.

Figure 5:
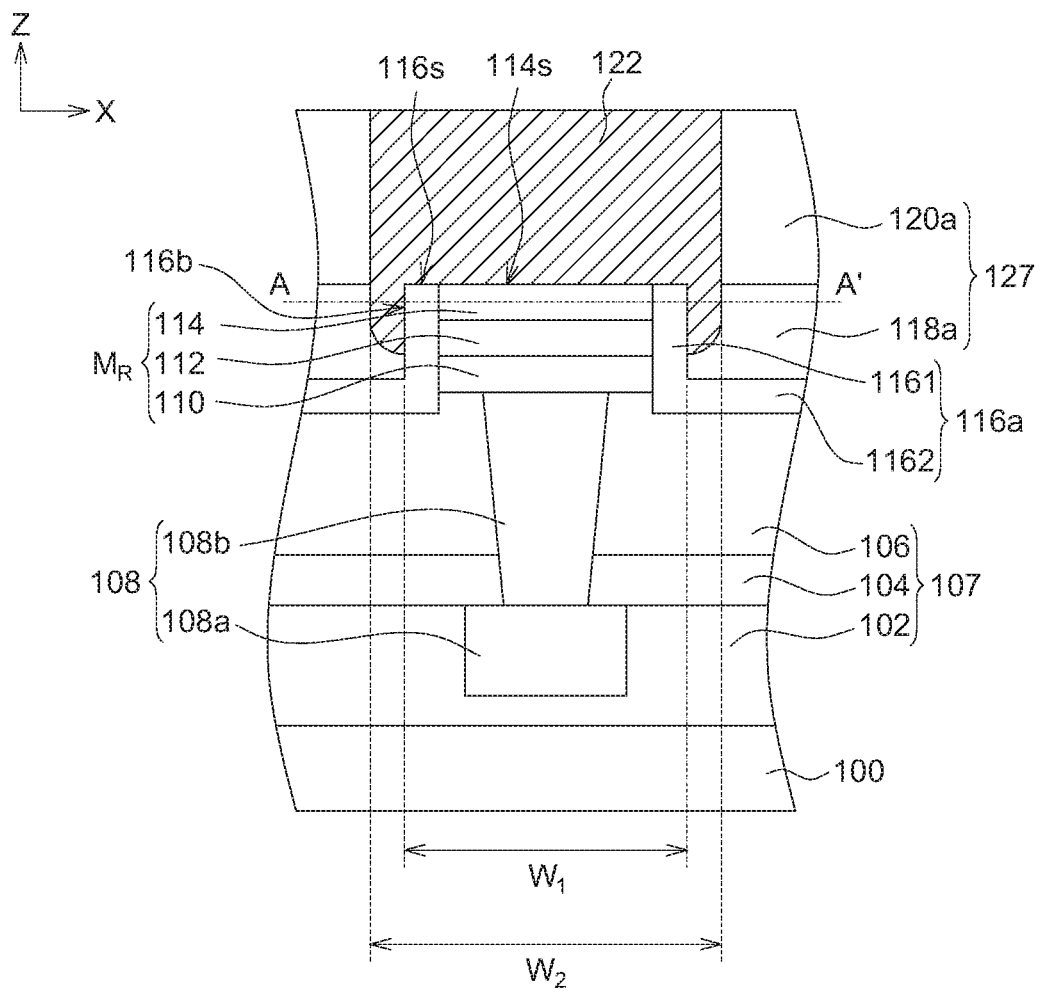

Referring to FIG. 5, an opening is formed penetrating the fourth dielectric material layer 118 and the fifth dielectric material layer 120 to form an upper dielectric layer 127 including the fourth dielectric layer 118a and the fifth dielectric layer 120a. That is, the opening is formed in the upper dielectric layer 127. Then, a conductive material is filled in the opening to form an upper interconnect structure 122 in the upper dielectric layer 127. The upper interconnect structure 122 is disposed on the top electrode 114 and is electrically connected to the top electrode 114, and directly contact a sidewall of the protection layer 116a. In this way, a RRAM structure 10 according to one embodiment of the present invention is formed.

Figure 6:
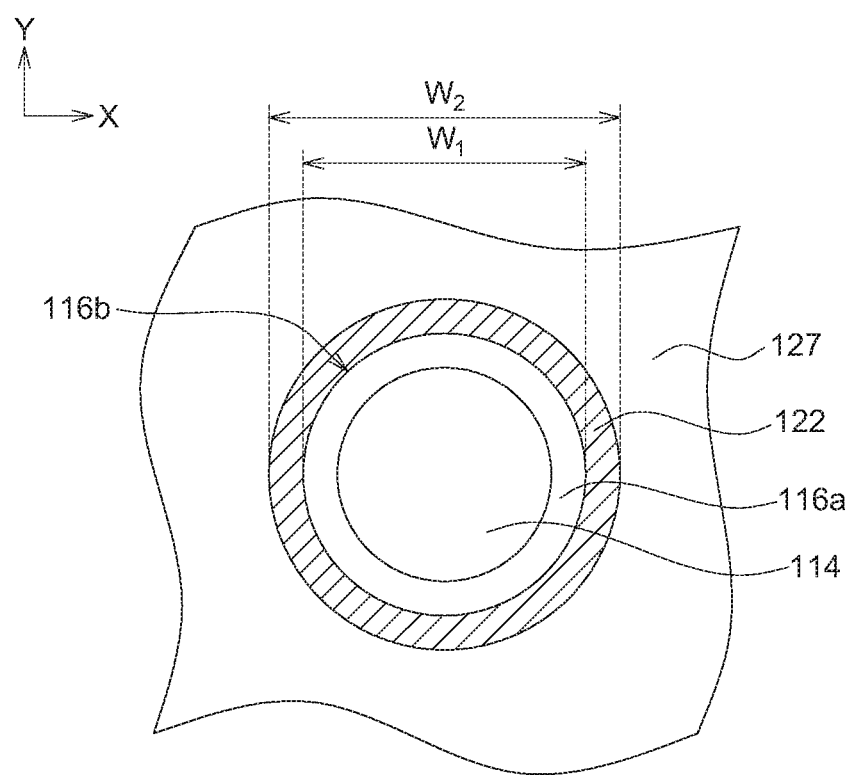
FIG. 6 is a top view along line A-A' of FIG. 5.

FIG. 6 is a top view along line A-A' of FIG. 5, and illustrates a plane of a X-axis and a Y-axis, for example. The X-axis may be perpendicular to the Z-axis and a Y-axis, but the present invention is not limited thereto.

Referring to FIGS. 5 and 6, the connection portion 1161 of the protection layer 116a may have a first width $W_1$ smaller than a second width $W_2$ of the upper interconnect structure 122, and the upper interconnect structure 122 directly contacts the sidewall 116b of the protection layer 116a. At least a portion of the upper interconnect structure 122 surrounds the protection layer 116a. Since the upper interconnect structure 122 can directly contact the sidewall 116b of the protection layer 116a, the upper interconnect structure 122 can securely contact the top electrode 114 without deviating from the top electrode 114 during manufacturing the upper interconnect structure 122, and the electrical connection between the upper interconnect structure 122 and the top electrode 114 can be well established.

In the present embodiment, the RRAM cell $M_R$ is exemplified as a round shape, but the present invention is not limited thereto.

In some embodiments, the upper interconnect structure 122 may be a via, a trench or a combination thereof. The upper interconnect structure 122 may be a single-layer structure or a multi-layer structure. A barrier layer (not shown) may be formed between the upper interconnect structure 122 and the upper dielectric layer 127.

Although the RRAM structure 10 may be manufactured by the aforementioned manufacturing method in this embodiment, it is merely an example and the manufacturing method of the RRAM structure 10 of the present invention is not limited thereto.

According to one embodiment of present invention, the RRAM structure 10 includes a bottom electrode 110; a variable resistance layer 112 disposed on the bottom electrode 110; a top electrode 114 disposed on the variable resistance layer 112; and a protection layer 116a surrounding the variable resistance layer 112, wherein a top surface 116s of the protection layer 116a and a top surface 114s of the top electrode 114 are coplanar; and an upper interconnect structure 122 disposed on the top electrode 114, wherein the upper interconnect structure 122 is electrically connected to the top electrode 114 and directly contacts a sidewall 116b of the protection layer 116a.

In summary, in the RRAM structure 10 and the manufacturing method thereof according to one embodiment of present invention, since a top surface of the protection layer and a top surface of the top electrode are coplanar, the sidewall of the RRAM cell can be well protected by the protection layer to prevent from a short issue between the variable resistance layer and the upper interconnect structure, and the RRAM can have good electrical performance. Moreover, since the upper interconnect structure directly contacts a sidewall of the protection layer, the upper interconnect structure can securely contact the top electrode without deviating from the top electrode during manufacturing the upper interconnect structure, and the electrical connection between the upper interconnect structure and the top electrode can be well established.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A resistive random access memory structure, comprising:
   a bottom electrode;
   a variable resistance layer disposed on the bottom electrode;
   a top electrode disposed on the variable resistance layer;
   a protection layer surrounding the variable resistance layer, wherein a top surface of the protection layer and a top surface of the top electrode are coplanar, and an upper end of the protection layer and an upper end of the top electrode have a same height relative to the substrate; and
   an upper interconnect structure disposed on the top electrode, wherein the upper interconnect structure is electrically connected to the top electrode and directly contacts a sidewall of the protection layer.

2. The resistive random access memory structure according to claim 1, further comprising a lower interconnect structure electrically connected to the bottom electrode.

3. The resistive random access memory structure according to claim 1, wherein at least a portion of the upper interconnect structure surrounds the protection layer.

4. The resistive random access memory structure according to claim 1, wherein the protection layer has a L shape in a cross-section view.

5. The resistive random access memory structure according to claim 1, wherein the protection layer comprises a connection portion and an extension portion, the connection portion directly contacts sidewalls of the top electrode, the variable resistance layer and the bottom electrode, and the extension portion is connected to a lower portion of the connection portion.

6. The resistive random access memory structure according to claim 5, wherein the connection portion has a first width smaller than a second width of the upper interconnect structure.

* * * * *